United States Patent [19]
Ruff

[11] Patent Number: 6,028,451
[45] Date of Patent: Feb. 22, 2000

[54] METHOD AND APPARATUS FOR TOPOLOGY DEPENDENT SLEW RATE CONTROL

[75] Inventor: Klaus Ruff, Beaverton, Oreg.

[73] Assignee: Intel Corporation, Santa Clara, Calif.

[21] Appl. No.: 09/001,256

[22] Filed: Dec. 31, 1997

[51] Int. Cl.$^7$ .............................................. H03K 19/0175
[52] U.S. Cl. ................................. 326/82; 326/30; 326/87
[58] Field of Search ................................. 326/17, 30, 37, 326/83, 86, 87, 80, 81

[56] References Cited

U.S. PATENT DOCUMENTS

| | | | |
|---|---|---|---|
| 5,107,230 | 4/1992 | King | 326/30 |
| 5,534,801 | 7/1996 | Wu et al. | 327/72 |
| 5,596,285 | 1/1997 | Marbot et al. | 326/30 |
| 5,638,007 | 6/1997 | Sabin | 326/27 |
| 5,767,695 | 6/1998 | Takekuma et al. | 326/30 |
| 5,838,168 | 11/1998 | Petersen | 326/81 |
| 5,926,032 | 7/1999 | Gebara et al. | 326/30 |

*Primary Examiner*—Michael Tokar
*Assistant Examiner*—Don Phu Le
*Attorney, Agent, or Firm*—Blakely, Sokoloff, Taylor & Zafman LLP

[57] ABSTRACT

A slew rate control circuit of a bus includes two connection devices that are adapted to be coupled to two voltage supplies. The connection devices are connected to the bus by a select terminal of a signal application device. The signal application device has first and second positions which apply first and second amounts of resistance to the bus depending on the voltage on the select terminal. If an expansion board is adapted to be coupled to the bus, a different voltage is applied on the select terminal. A method for controlling a slew rate includes applying a resistive load to a bus corresponding to the number of logic circuits in a computer system. The number of logic circuits within the computer is varied by either adding or removing a logic circuit. A second resistive load is selected to be applied to the bus after the number of logic circuits in the computer system has been varied. The selection of a second resistance enables the amount of slew rate to be reduced.

12 Claims, 7 Drawing Sheets

METHOD AND APPARATUS FOR TOPOLOGY DEPENDENT SLEW RATE CONTROL

BACKGROUND OF THE INVENTION

1. Field of the Invention

The present invention relates in general to the field of integrated circuits and, more particularly, to integrated circuits used with digital devices. Specifically, the invention relates to method and apparatus of adjusting the slew rate dependent of the topology.

2. Description of the Related Art

Digital signals are generally defined as signals that have two states (e.g., a high state and a low state) in which the voltage level of each of the states is within its own predetermined range. For example, a signal in a high state may have a voltage level equal to approximately $V_{cc}$, while a low voltage level may have a voltage equal to approximately $V_{ss}$. Ideally, a transition between digital states occurs instantaneously, resulting in a vertical line that has an infinite slope. In is actuality, a digital signal changes state over a specified period of time, providing a non-infinite slope that is equal to the time rate of change of the signal voltage. The time rate of change from one state to another state for a digital signal is defined as the slew rate, and it is typically measured in units of volts/time.

In computer systems, signals are generally transmitted throughout the system on a bus, which is a complex conglomeration of wire connections on which signals are applied. The operating frequency of the bus is a function of the output delay time, the flight time, the setup time, and the rise/fall time. All of the previously recited times, are slew rate independent. The flight time is the time it takes a signal to get from the output of an output buffer to the input of a receiver, which depends upon the slew rate. The rise/fall time, which also depends on slew rate, is the amount of time required to transition from one state to another state.

Generally, the faster the bus (i.e., the higher the operating frequency of the bus), the faster signals are transported along the bus, allowing for signals to be available for processing considerably earlier than they would otherwise have been. Assuming that a computer system can process these recently available signals, increasing the slew rate could increase the processing speed of the computer system.

As previously mentioned, a bus is the mechanism by which signals are transmitted throughout a computer system. The bus, for example, may be used to read and write information for a processor from and to a memory card. A bus configuration (i.e., topology) with connection devices only at both ends of the bus will allow a high slew rate and therefore a high operating frequency. Often, it is desired to add additional connection devices to a bus, such as, for example, a second processor card or a second memory card. In this case, the topology of the bus has been altered by connecting the additional load on the bus. One skilled in the art will appreciate that by connecting a "stub" to the bus, the slew rate at which the bus can operate will decrease. In today's computer systems the slew rate of devices connected to a bus is fixed for the worst possible configuration, i.e., in the example above, the slew rate of the processor and memory connection devices would always be permanently set to a slow enough value to allow the insertion of a third or additional connection devices even if the default configuration has only the two minimally required connection devices. Thus, it would be beneficial to have a method and apparatus of adjusting the slew rate of devices connected to a bus dependent on the actual configuration of the bus.

SUMMARY OF THE INVENTION

An embodiment of the present invention relates to a slew rate control circuit. The invention includes two connection devices that are adapted to be coupled to two voltage supplies. The connection devices are connected to the bus by a select terminal of a signal application device. The signal application device has first and second positions which apply first and second amounts of resistance to the bus depending on the voltage on the select terminal. If an expansion board is adapted to be coupled to the bus, a different voltage is applied on the select terminal.

An alternative embodiment of the present invention relates to a method for reducing a slew rate which includes applying a resistive load to a bus corresponding to the number of logic circuits in a computer system. The number of logic circuits within the computer is varied by either adding or removing a logic circuit. A second resistive load is selected to be applied to the bus after the number of logic circuits in the computer system has been varied. The selection of a second resistance enables the amount of slew to be reduced.

BRIEF DESCRIPTION OF THE DRAWINGS

Other objects and advantages of the present invention will become apparent upon reading the following detailed description and upon reference to the drawings in which.

Figure 1:
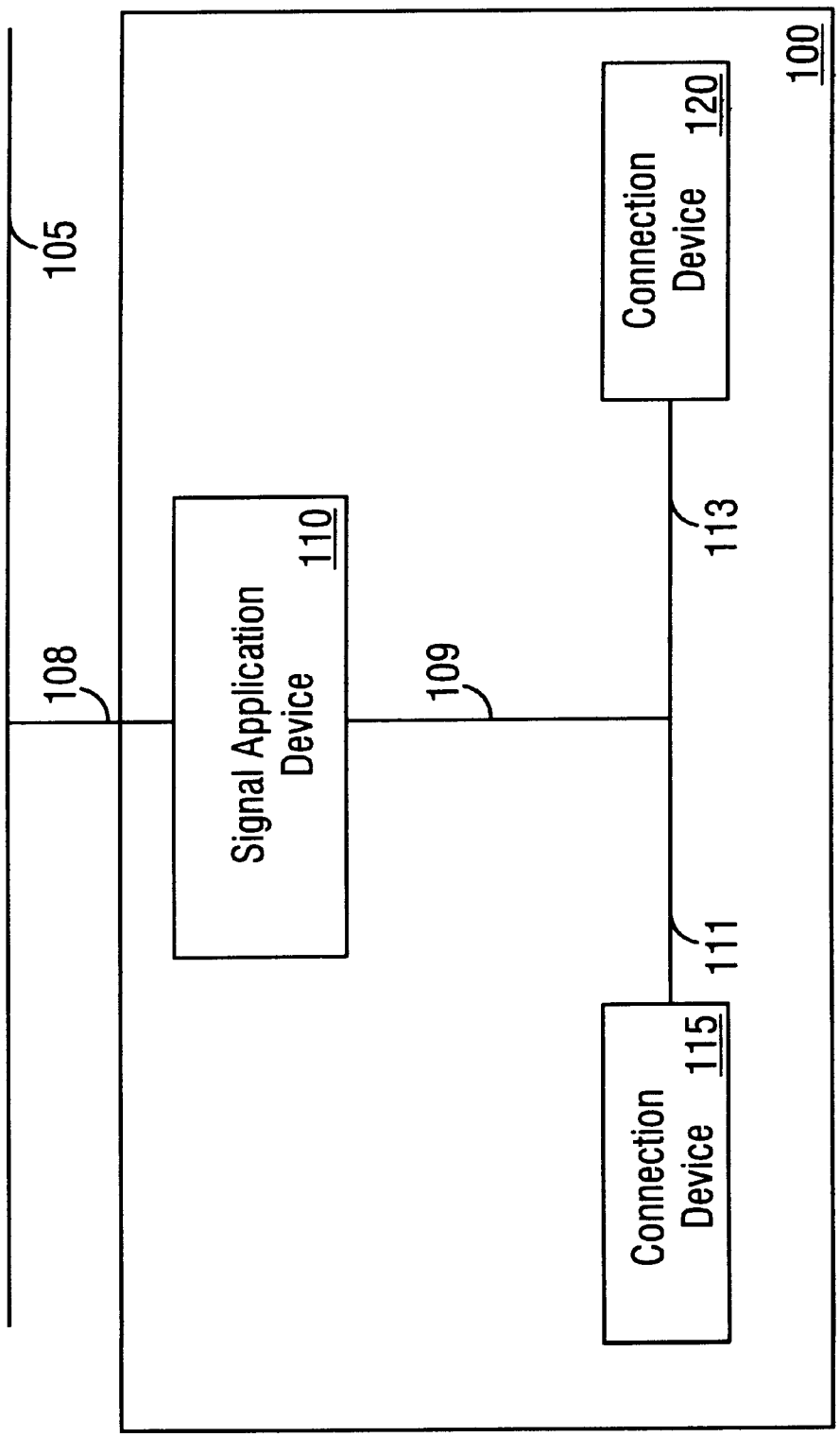
FIG. 1 is a simplified circuit diagram for a topology dependent slew rate control circuit according to an embodiment of the present invention.

While the invention is susceptible to various modifications and alternative forms, specific embodiments have been shown by way of example in the drawings and are described in detail. It should be understood, however, that the description herein of specific embodiments is not intended to limit the invention to the particular forms disclosed. On the contrary, the present intention is to cover all modifications, equivalents, and alternatives falling within the spirit and scope of the invention as defined by the appended claims.

DETAILED DESCRIPTION OF SPECIFIC EMBODIMENTS

Illustrative embodiments of the present invention are described below as they might be employed in a topology dependent slew rate control circuit. In the interest of conciseness, not all features of an actual implementation are described in this specification. It will of course be appreciated that in the development of any actual embodiment, numerous implementation-specific decisions must be made to achieve the developer's specific goals, such as compliance with system-related and business-related constraints. Moreover, it will be appreciated that even if such a development effort might be complex and time-consuming, it would nevertheless be a routine undertaking for one of ordinary skill in the art having the benefit of this disclosure.

Overview

A topology dependent slew rate control circuit 100 in accordance with an embodiment of the present invention is illustrated in FIG. 1. The slew reduction circuit 100 is coupled to a main bus 105 by a line 108. Attached to the bus 105 is a processor (not shown), which can be used to initiate the transmission and receipt of signals along the bus 105. The bus 105 may have several lines (e.g., 108) that are connected to other types of circuitry. One skilled in the art will appreciate that if a signal is applied to the bus 105 by the processor (not shown), it will be applied to all of the lines attached to the bus 105.

The topology dependent slew rate control circuit 100 includes connection devices 115, 120. The line 108 serves as an output terminal for a signal application device 110, providing a path by which an output signal from the signal application device 110 is applied to the bus 105. A line 109 serves as an input terminal and allows signals present on lines 111 and 113 from the connection devices 115, 120 to be sent to the signal application device 110. One skilled in the art will appreciate that by varying the signal applied to the line 109 of the signal application device 110, the output signal applied to the line 108 will vary. Thus, the topology dependent slew rate control circuit 100 may be used to vary the slew rate of the bus 105.

Specific Embodiments

Figure 2A:
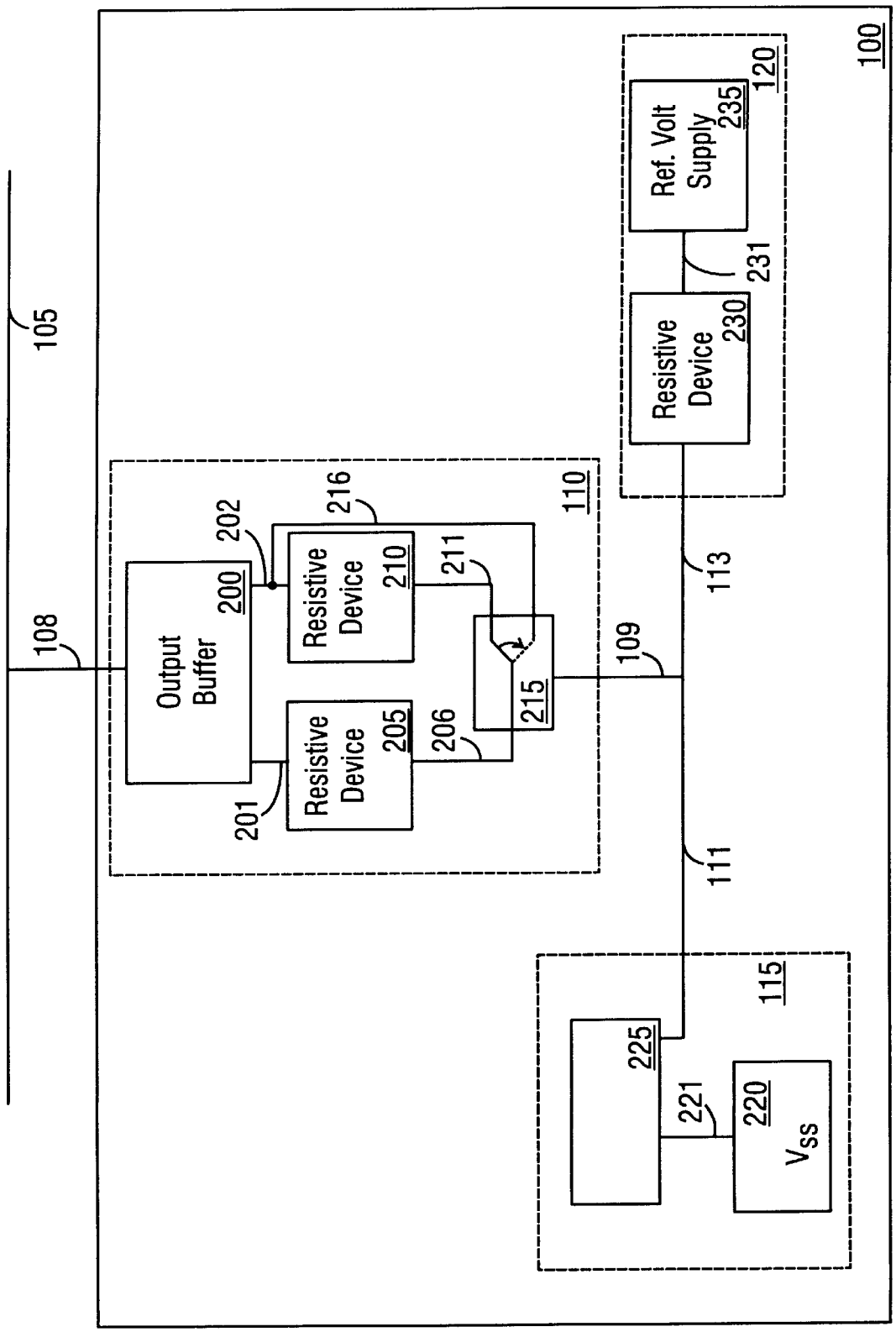
FIG. 2A is a detailed view of a first embodiment of the topology dependent slew rate control circuit of FIG. 1.
Figure 2B:
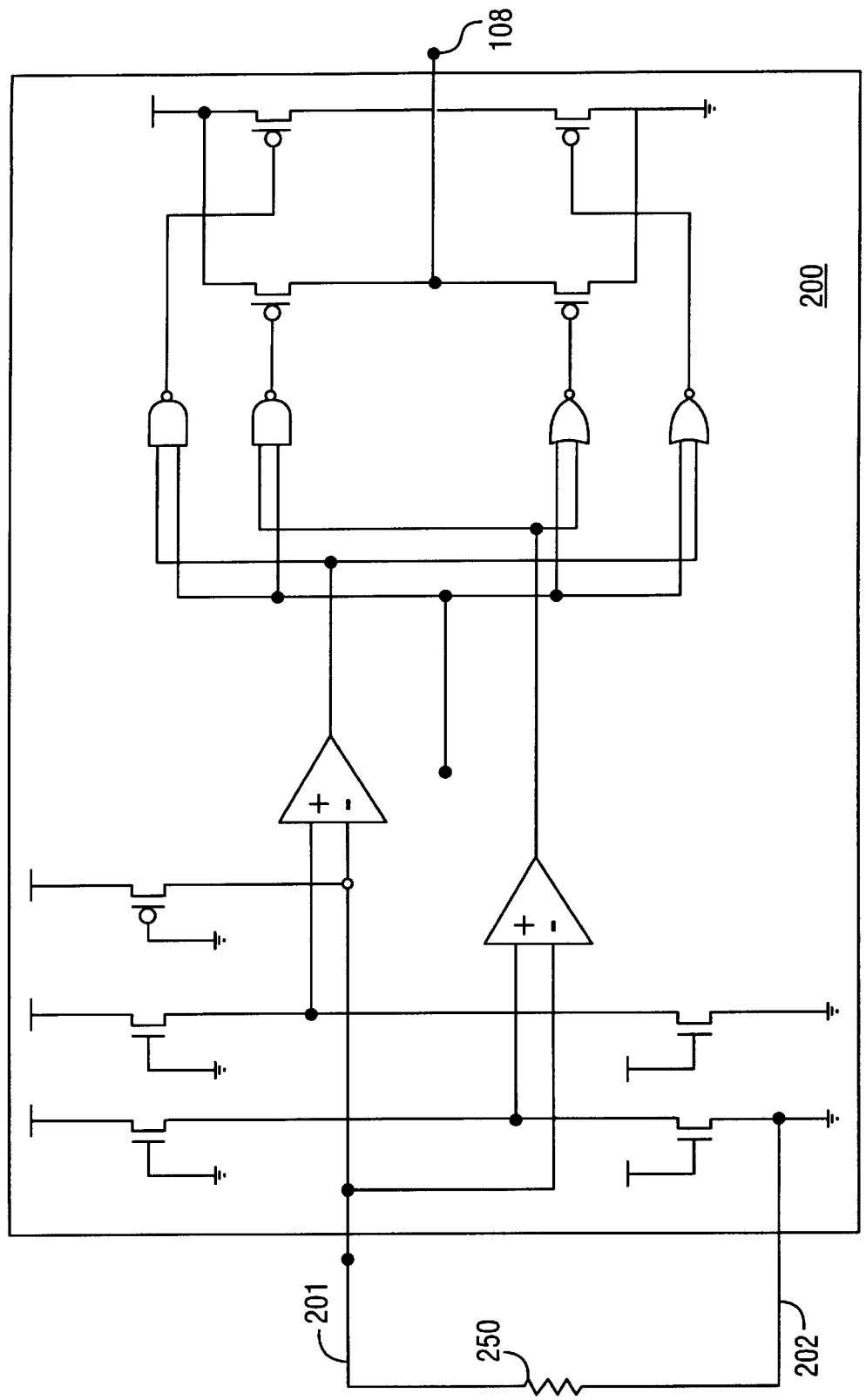
FIGS. 2B and 2C are circuit diagrams for the buffer and switch of FIG. 2A.

FIG. 2A is a more detailed view of some of the components of the slew reduction circuit 100. The signal application device 110 includes an output buffer 200, two resistive devices 205, 210, and a switch 215. The output buffer 200 has two input terminals 201, 202 and the output terminal 108. The specifics regarding the operation of the output buffer 200 have not been included so as not to obscure the present invention. A simple conceptual diagram for one embodiment of the output buffer 200, whose impedance is controlled by an external resistor 250, is shown in FIG. 2B. The resistive device 205 has a first terminal 201 and a second terminal 206, which serves as one input terminal for the switch 215. The resistive device 210 has a first terminal 202 and a second terminal 211, which serves as one output terminal for the switch 215. An alternative output terminal 216 for the switch 215 is connected to the input terminal 202 of the output buffer 200.

Figure 2C:
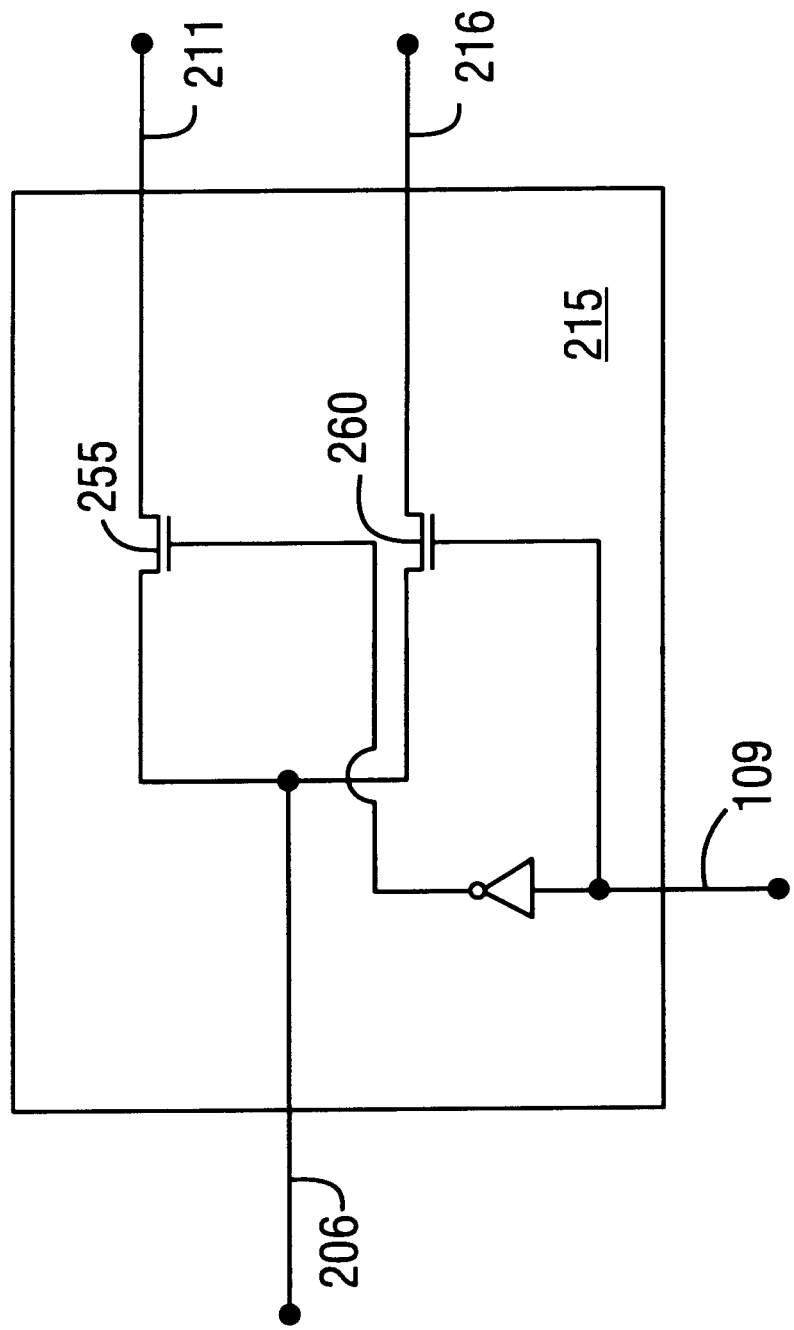

FIG. 2C is a circuit diagram for one implementation of the switch 215, which has an input terminal 206, a select terminal 109, and two output terminals 211, 216. The select terminal 109 connects the input terminal 206 to one of the output terminals. If a logically low signal, for example, is applied to the select terminal 109, a transistor 255 will turn "on," allowing current to flow from the input terminal 206 to the output terminal 211. If a logically high signal is applied to the select terminal 109, the transistor 260 is turned "on," allowing current to flow from the input terminal 206 to the output terminal 216. The switch 215 has two positions associated with the selection of the transistors 255, 240.

When the switch 215 is in a first position, the transistor 255 is selected and the input terminal 206 is connected to the output terminal 211. In contrast, when the switch 215 is in the second position, the input terminal 206 is connected to the output terminal 216. As previously mentioned, the signal applied to the select terminal 109 selects the position of the switch 215. When the switch 215 is in the second position (i.e., the terminal 206 is connected to the terminal 216), a resistance equal to the resistance of the first resistive device 205 is applied between the input terminals 201, 202 of the buffer 215. When the switch 215 is in the first position (i.e., the terminal 206 is connected to the terminal 211), a resistance equal to the serial combination of the first and second resistive devices 205, 210 is applied between the input terminals 201, 202. One skilled in the art will appreciate that the present configuration of the signal application device 110 allows for a variation of the resistance applied between the input terminals 201, 202 when the switch 215 changes position. By varying the resistance applied between the terminals 201, 202 of the output buffer 200, the slew of the bus 105 may be adjusted.

The value of the signal applied to the terminal 109 may vary depending upon the voltage supply connected to it. The first connection device 115 has a terminal 111 connected to the line 109. Within the first connection device 115, there is a ground voltage supply 220 with a terminal 221. The ground voltage supply 220 generates a logically low voltage (e.g., $V_{ss}$). Both the terminals 111 and 221 are connected to an expansion board connector 225. The connector 225 enables additional expansion boards (not shown) to be coupled to the slew reduction circuit 100. If the expansion board 225 is present and connects the terminal 221 to the terminal 111, a logically low voltage will be applied to the line 109. If a logically low voltage is applied to the line 109, the switch 215 goes to its first position and applies a resistance equivalent to the sum of the resistance of the resistive devices 205, 210 between the input terminals 201, 202.

The second connection device 120 includes a resistive device 230, which has a terminal 113 connected to the line 109, and a terminal 231 connected to a reference voltage supply 235. The reference voltage supply 235 generates a logically high voltage (e.g., $V_{cc}$). In the absence of an expansion device (not shown) coupled to the expansion board 225, the line 109 is always electrically connected to the reference voltage supply 235 through the resistive device 230. Thus, normally, a logically high voltage level will be applied to the line 109, in which case the switch 215 will be in the second position and apply a resistance equal to the resistance of the resistive device 205 between the input terminals 201, 202 of the output buffer 200.

Figure 3:
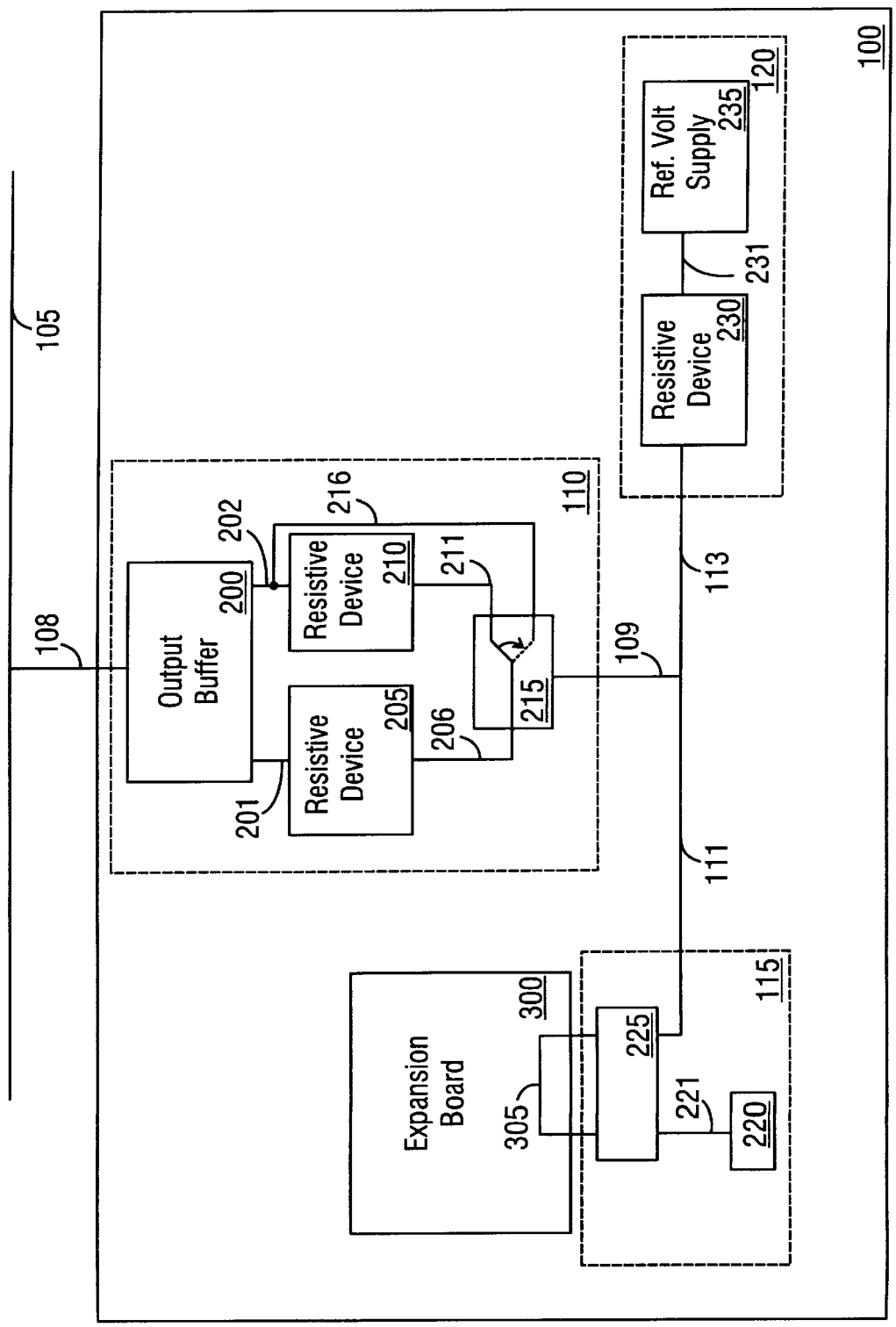
FIG. 3 is a circuit diagram of the slew reduction circuit of FIG. 2 with an expansion board connected.

FIG. 3 illustrates the topology dependent slew rate control circuit 100 in which an expansion board 300 has been connected. One skilled in the art will appreciate that the addition of expansion boards, processor cards, memory cards (e.g., sound cards, video adapters, accelerator boards, television boards, etc.) can be used to increase the capacity of a computer system. As previously mentioned, the addition of the expansion board 300 to the circuitry connected to the bus 105 generally causes a change in the bus topology and a need to reduce the slew rate of the bus 105. The expansion board 300 includes a line 305. When the expansion board 300 is coupled to the expansion board connector 225, the line 305 forms a connection between the terminal 111 and the terminal 221. By connecting the terminal 111 to the terminal 221, a low voltage is applied to the terminal 111. Thus, the expansion board causes the low voltage of the voltage supply 220 to be applied to the line 109. The low voltage on the line 109 causes the switch 215 to go to the first position connecting both the resistive devices 205, 210 between the input terminals 201, 202. Thus, the total external resistance applied to the output buffer 200 is increased, because the second resistive device 210 is added in series when the expansion board 300 is coupled to the expansion board connector 225.

The output buffer 200 can be constructed such that an increase of the external resistance between the input terminal 201 and the input terminal 202 leads to an reduction in the slew of the buffer 200. Then, the increase in external resistance caused by connecting the expansion device correspondingly reduces the slew of the bus 105. Thus, the addition of expansion board 300 results in essentially an automatic adjustment of the slew rate by the slew reduction circuit 100. In alternate embodiments, the slew reduction circuit 100 may be constructed such that an decrease in the external resistance causes a reduction of the slew rate.

Figure 4:
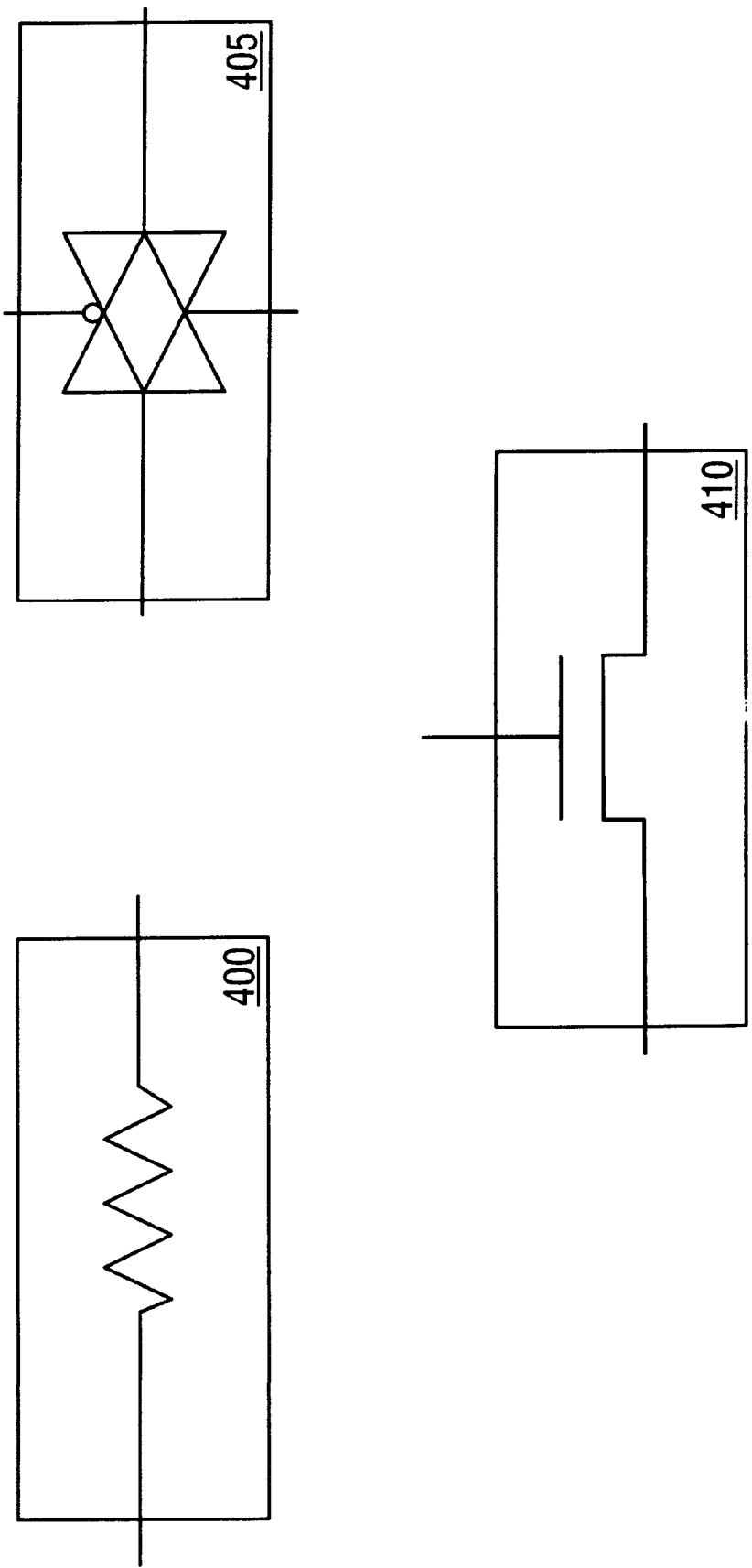
FIG. 4 illustrates types of resistive devices that can be used with the topology dependent slew rate control circuit of FIG. 2.
Figure 5:
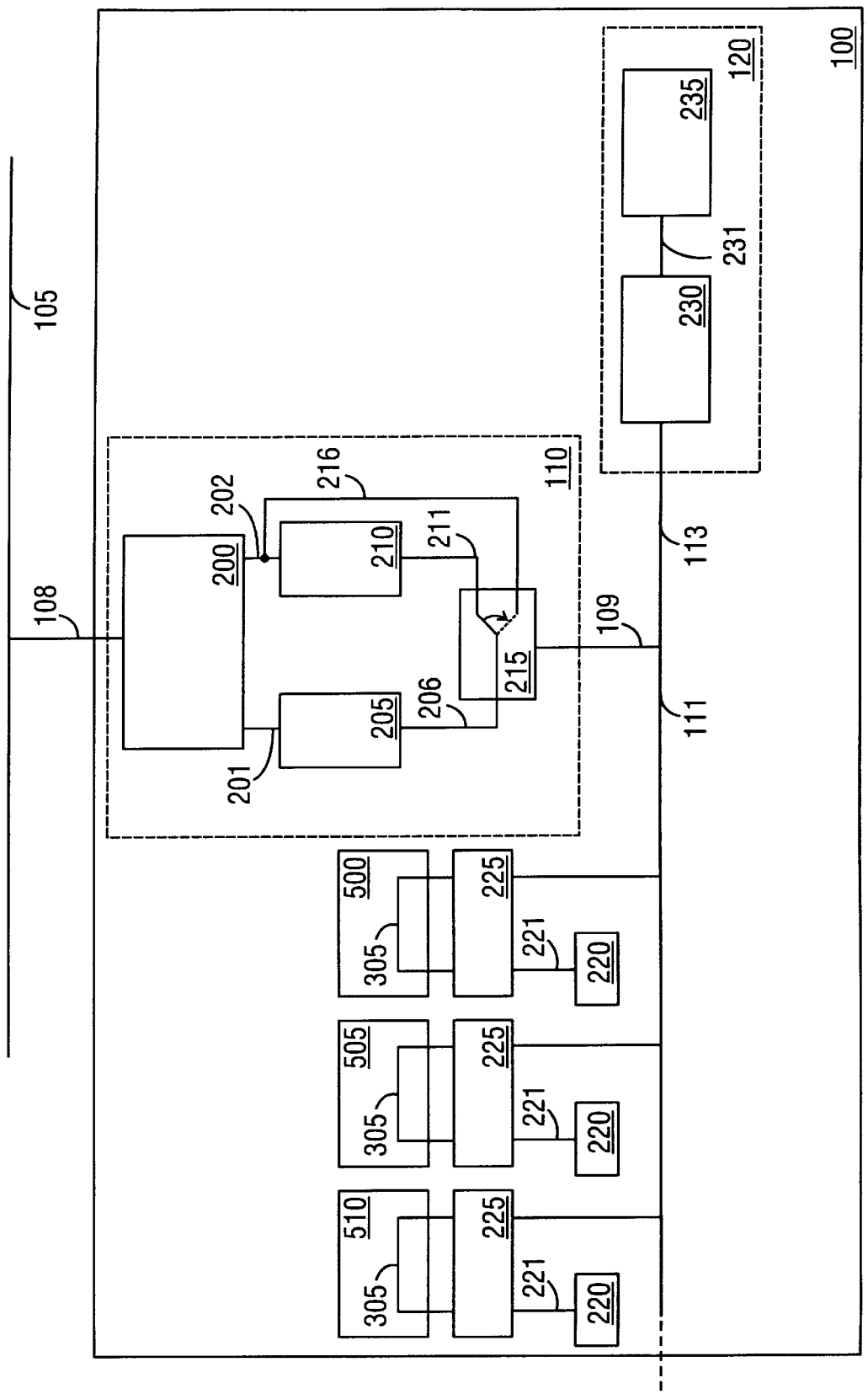
FIG. 5 illustrates a second embodiment for a topology dependent slew rate control circuit according to the present invention.

One skilled in the art will appreciate that resistive devices 205, 210, 230 may be any type of resistive devices, three of which are shown in FIG. 4. These resistive devices may be a resistor 400, a transmission gate 405, or a transistor 410. The slew reduction circuit 100 may also be modified to accommodate multiple expansion boards, as shown in FIG. 5. In FIG. 5, three expansion boards 500, 505, 510 have been connected to the slew reduction circuit 100. The slew reduction circuit 100 provides a mechanism to adjust the slew rate when the load of the bus 105 changes. By intrinsically adjusting the slew rate of the bus 105, the bus 105 is able to function at the optimum operating frequency. The use of this optimum frequency allows a computer system to make full use of a given bus, which may increase the processing speed of the system.

It will be appreciated by those of ordinary skill in the art having the benefit of this disclosure that numerous variations from the foregoing illustration will be possible without departing from the inventive concept described herein. Accordingly, it is the claims set forth below, and not merely the foregoing illustration, which are intended to define the exclusive rights of the invention.

What is claimed is:

1. A slew rate control circuit for a bus in a computer system, said slew rate control circuit comprising:
   a buffer having first and second terminals, said buffer circuit being adapted to be coupled to said bus;
   first and second connection devices adapted to be coupled to first and second voltage supplies; and
   a selection device coupled to said buffer circuit, said selection device having a select terminal and being adapted to apply a first resistance between said first and second terminals of said buffer in response to said select terminal being coupled to said first voltage supply, said selection device applying a second resistance between said first and second terminals of said buffer in response to said select terminal being coupled to said second voltage supply.

2. The slew rate control circuit of claim 1 further comprising at least one expansion board having a first terminal adapted to be coupled to said first connection device to connect said second voltage supply to said select terminal.

3. The slew rate control circuit of claim 2 wherein said expansion board is selected from the group of expansion boards consisting of a processor card, a memory card, an accelerator board, a television board, a video adapter, and a sound card.

4. A topology dependent slew rate control circuit comprising:
   an output buffer having first and second terminals, said output buffer being adapted to be coupled to a bus;
   first and second connection devices adapted to be coupled to first and second voltage supplies;
   a first resistive device having a first and second end, said first end being coupled to said first terminal of said output buffer;
   a second resistive device having a first and second end, said first end being coupled to said second terminal of said output buffer; and
   a switch having first and second modes of operation and a select terminal coupled to said first and second connection devices, said switch coupling together the second ends of said first and second resistive devices in said first mode of operation, and coupling the second end of said first resistive device to the second terminal of said output buffer in said second mode of operation, said select terminal causing said switch to enter said first and second modes of operation in response to being connected to said first and second voltage supplies, respectively.

5. The topology dependent slew rate control circuit of claim 4 further comprising an expansion board coupled to said first connection device wherein said expansion board is an expansion board selected from the group of expansion boards consisting of a processor card, a memory card, an accelerator board, a television board, a video adapter board, and a sound card.

6. The topology dependent slew rate control circuit of claim 5 wherein said select terminal is coupled to said first voltage supply in response to said expansion board being coupled to said first connection device.

7. The topology dependent slew rate control circuit of claim 4 wherein said resistive devices are selected from the group of resistive devices consisting of resistors, transistors, and transmission gates.

8. A slew topology dependent slew rate control circuit comprising:
   first and second connection devices adapted to be coupled to first and second voltage supplies; and
   means for applying a signal to a bus, said applying means having a first and second resistance and a select terminal coupled to said first and second connection devices, said applying means coupling the first resistance to said bus in response to said select terminal being connected to said first voltage supply, and said applying means coupling the second resistance to said bus in response to said select terminal being connected to said second voltage supply.

9. The topology dependent slew rate control circuit of claim 8 further comprising at least one expansion board having a first terminal adapted to be coupled to said first connection device to connect said second voltage supply to said select terminal.

10. The topology dependent slew rate control circuit of claim 9 wherein said expansion board is selected from the group of expansion boards consisting of an accelerator board, a television board, a video adapter, and a sound card.

11. A computer system comprising:
    a bus; and
    a slew rate control circuit including:
       a buffer having first and second terminals, said buffer circuit being adapted to be coupled to said bus, the buffer adapted to adjust the slew rate of the bus to a first value in response to a first resistance existing between the first and second terminals and adjust the slew rate to a second value in response to a second resistance existing between the first and second terminals;
       first and second connection devices adapted to be coupled to first and second voltage supplies; and
       a selection device coupled to said buffer circuit, said selection device having a select terminal and being adapted to apply the first resistance between said first and second terminals in response to said select terminal being coupled to said first voltage supply, said selection device to apply a second resistance between said first and second terminals in response to said select terminal being coupled to said second voltage supply.

12. The computer system as set forth in claim 11, further comprising a expansion board, the circuit board being adapted to couple the second voltage supply to the select terminal in response to a device being attached to the expansion board.

* * * * *

UNITED STATES PATENT AND TRADEMARK OFFICE
CERTIFICATE OF CORRECTION

PATENT NO. : 6,028,451
DATED : February 22, 2000
INVENTOR(S) : Ruff

It is certified that error appears in the above-identified patent and that said Letters Patent is hereby corrected as shown below:

In column 1, at line 21, delete "is".

Signed and Sealed this

Fifteenth Day of May, 2001

Attest:

NICHOLAS P. GODICI

Attesting Officer     Acting Director of the United States Patent and Trademark Office